(12) United States Patent
Kusabiraki et al.

(10) Patent No.: US 6,720,713 B2
(45) Date of Patent: Apr. 13, 2004

(54) PIEZOELECTRIC RESONANT COMPONENT

(75) Inventors: Shigemasa Kusabiraki, Takaoka (JP);
Takeshi Yamazaki, Ishikawa-ken (JP);
Yuji Kosugi, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/861,733

(22) Filed: May 21, 2001

(65) Prior Publication Data

US 2002/0011763 A1 Jan. 31, 2002

(51) Int. Cl.$^7$ .............................................. H01L 41/08
(52) U.S. Cl. ........................ 310/345; 310/344; 310/346
(58) Field of Search ................................. 310/344, 345, 310/346, 327, 363

(56) References Cited

U.S. PATENT DOCUMENTS

| | | | |
|---|---|---|---|
| 3,836,794 A | * 9/1974 | Shimizu et al. | 310/354 |
| 4,297,607 A | * 10/1981 | Lynnworth et al. | 310/334 |
| 4,479,069 A | * 10/1984 | Miller | 310/334 |
| 4,571,520 A | * 2/1986 | Saito et al. | 310/327 |
| 5,250,870 A | * 10/1993 | Fenlon et al. | 310/345 |
| 5,925,974 A | * 7/1999 | Yamamo et al. | 310/348 |
| 5,962,956 A | 10/1999 | Unami et al. | |
| 6,016,024 A | * 1/2000 | Unami et al. | 310/345 |
| 6,057,634 A | * 5/2000 | Yoshino et al. | 310/348 |

FOREIGN PATENT DOCUMENTS

| | | |
|---|---|---|
| CN | 1211106 A | 3/1999 |
| JP | 61-212108 A | 9/1986 |
| JP | 4-369909 A | 12/1992 |
| JP | 10-163794 | 6/1998 |
| JP | 10-200366 | 7/1998 |
| JP | 11-008526 A | 1/1999 |
| JP | 11-112277 A | 4/1999 |

\* cited by examiner

*Primary Examiner*—Mark Budd
(74) *Attorney, Agent, or Firm*—Keating & Bennett, LLP

(57) ABSTRACT

While suppressing that a vibration of a piezo-electric element propagates to a substrate by devising the composition of an electro-conductive support body, the piezoelectric resonant component which secures electroconductivity and can maintain a fall-proof shock property is provided. The piezoelectric resonant component has a substrate 20 on the top surface of which pattern electrodes 21 and 22 are formed, and on the lower surface of which it has electrodes 8 and 9. It has a piezoelectric element 1 using the length vibration on the substrate 20. Electro-conductive support bodies 10 and 11 are fixed to the length direction center section of the lower surface electrodes of the piezoelectric element 1. The connection fixation of these support bodies 10 and 11 to the pattern electrodes 21 and 22 of the substrate 20 is performed by electro-conductive adhesives 12 and 13. The electro-conductive support bodies 10 and 11 include an urethane resin which contains an electro-conductive filler, making the rate of content of the electro-conductive filler 75–85 wt %.

18 Claims, 8 Drawing Sheets

WAVE FORM OF ELEMENT ONLY

WAVE FORM AFTER THE ELEMENT IS MOUNTED ON THE SUBSTRATE

PIEZOELECTRIC RESONANT COMPONENT

BACKGROUND OF THE INVENTION

1. Field of the Invention

The present invention relates to piezoelectric resonant components, such as an oscillator, a discriminator, and a filter, and especially relates to a piezoelectric resonant component in which a piezoelectric element vibrating in a longitudinal vibration mode is mounted on a substrate.

2. Description of the Related Art

Conventionally, an electro-conductive support body is fixed to a center section (a node portion) of a lower surface electrode of a piezoelectric element that vibrates in a longitudinal vibration mode. While connecting the support body via an electro-conductive adhesive to a pattern electrode on a substrate, a top surface electrode of the piezoelectric element is connected to a pattern electrode of another substrate via wire bonding. A piezoelectric resonant component having such a structure is proposed in, for example, Japanese unexamined published patent application No. 10-200366. The electro-conductive support body is formed by coating an electro-conductive paste on the electrode of the piezoelectric element so as to have a predetermined thickness and then hardening the paste.

In a case of the piezoelectric resonant component having the structure described above, there are some components that cause disorder in the phase characteristics or the impedance waveform as shown in FIG. 1. The disorder of this waveform is generated because the electric connection with the piezoelectric element is achieved by using the electro-conductive support body and the electro-conductive adhesive, while the piezoelectric element is supported but separated from the substrate. Through the electro-conductive support body and the electro-conductive adhesive, vibration of the piezoelectric element proceeds to a substrate side, such that the piezoelectric element and the substrate cause an integral vibration. FIG. 1A shows a waveform of a single piezoelectric element, and FIG. 1B shows a waveform of the piezoelectric element after being mounted on a substrate.

The reason why the vibration of the piezoelectric element is transmitted to the substrate side is because the electro-conductive support body and the electro-conductive adhesive define a pathway for vibration propagation. Thus, in order to suppress such a vibration propagation of the piezoelectric element, the following two methods can be considered.

The first method involves reducing the attaching area in the length direction of the piezoelectric element of the electro-conductive support body, and suppressing the vibration propagation of the piezoelectric element. However, this method results in a reduction in the support strength of the piezoelectric element such that the electro-conductive support body is easily peeled from the substrate or is removed from the piezoelectric element by an impact or dropping shock. Thus, this first method greatly reduces the reliability of the device.

The second method involves forming an electro-conductive support body of rubber elastic materials, such as a urethane resin. However, in order to provide electroconductivity in the electro-conductive support body, electro-conductive fillers such as Ag are used. If the content of this electro-conductive filler is decreased, electroconductivity is greatly reduced. If the content of the electro-conductive filler is increased instead, the elasticity will be greatly deteriorated.

SUMMARY OF THE INVENTION

In order to overcome the problems described above, preferred embodiments of the present invention provide a piezoelectric resonant component including an electro-conductive support body arranged to minimize propagation of vibration of a piezoelectric element to a substrate, while reliably achieving electroconductivity and shock-proof characteristics.

According to a first preferred embodiment of the present invention, a piezoelectric resonant component includes a substrate having a pattern electrode disposed on a top surface thereof, and a piezoelectric element vibrating in a longitudinal vibration mode and having an electrode disposed on the lower surface of the substrate, and an electro-conductive support body disposed on an approximately center section in the length direction of the lower surface electrode of the piezoelectric element, wherein the electro-conductive support body is fixed to the pattern electrode of the substrate by the electro-conductive adhesive, and the electro-conductive support body includes a urethane resin containing an electro-conductive filler which constitutes about 75% to about 85% by weight of the electro-conductive support body.

An approximately center section which constitutes a node portion of the electrode of the piezoelectric element is connected and fixed to the pattern electrode of the substrate through the electro-conductive support body and the electro-conductive adhesive. The electro-conductive support body preferably includes a urethane resin that is preferably made of a rubber elastic material. In order to provide electroconductivity in the urethane resin, electro-conductive fillers such as Ag are included. When decreasing the content of the electro-conductive filler, the electroconductivity will reduce, and when increasing the content of the electro-conductive filler, the vibration becomes easy to propagate causing unwanted vibration.

The inventors of the present invention discovered that, if the content of the electro-conductive filler exceeds about 85% by weight, the deterioration of the electrical property due to the vibration propagation will occur. Moreover, the strength deterioration of the urethane resin will also occur. Thus, the upper limit of the electro-conductive filler content in the electro-conductive support body is approximately 85% by weight.

Moreover, if the content of the electro-conductive filler is low, the rubber elasticity is improved and the property deterioration due to the vibration propagation is improved. However, if the content of the electro-conductive filler is less than about 75% by weight, the problems with the electric conduction property are generated.

Thus, the content of the electro-conductive filler in the electro-conductive support body is preferably about 75% to about 85% by weight. In addition, as an electro-conductive filler, an Ag filler, a Cu filler (or a filler which is formed by plating Ag on Cu), an Au filler, or other suitable fillers may be used.

Although it is also possible to replace a urethane resin with a silicone resin as the material for the electro-conductive support body, since there is almost no hardening contraction in the case of the silicone resin compared with the urethane resin, a lot of electro-conductive filler is needed to maintain electroconductivity, and, moreover, workability is bad when using silicone resin. On the other hand, in the case of a urethane resin, there are no such problems.

Since the piezoelectric element and the substrate are fixed through the electro-conductive support body containing a urethane resin in preferred embodiments of the present invention, even if an impact or external force such as a dropping shock is applied, the impact force is absorbed due to the elasticity of the electro-conductive support body. As a result, the impact force is prevented from affecting or cracking the piezoelectric element. Moreover, since the vibration propagation to the substrate is prevented by the elasticity of the electro-conductive support body from the piezoelectric element even when the attachment area of the electro-conductive support body, the piezoelectric element and the substrate are increased, there is no damage or connection-removal of the piezoelectric element despite the impact force applied thereto.

Although it is also possible to use a similar urethane group electro-conductive adhesive as an electro-conductive adhesive for attaching the electro-conductive support body and the substrate, the adhesive strength is not sufficient. On the other hand, in a case of an epoxy group electro-conductive adhesive, the adhesion strength is large, and moreover, since the rubber elasticity is not needed, it is preferable to use an epoxy group electro-conductive adhesive.

The piezoelectric element of various preferred embodiments of the present invention preferably includes two external electrodes which are arranged so that they connect the internal electrode and the pillar-shaped base in which the piezoelectric layer and the internal electrode are laminated in the length direction of the base alternately at one side surface of the base body.

The piezoelectric element is preferably polarized along the length direction thereof.

In such a laminated piezoelectric element, since the piezoelectric longitudinal effect is used, in which the direction of a polarization, the direction of an electric field, and the vibrating direction are the same, the electromechanical coupling coefficient is increased as compared with the piezoelectric element using the piezoelectric lateral effect in which the direction of polarization, the direction of an electric field, and the vibrating direction differ. Thus, the vibrating strength of the laminated piezoelectric element is strong (DELTA f of a resonator is large), and the laminated piezoelectric element tends to cause a vibrating leak. Therefore, by using the electro-conductive support body of preferred embodiments of the present invention, vibrating leaks are prevented and the device characteristics are greatly improved.

Moreover, in the case of the laminated piezoelectric element, since input/output electrodes can be formed on the whole surface thereof, if the input/output electrodes are connected and fixed to the pattern electrodes of the substrate through the electro-conductive support body, the step of connecting the top surface electrode to the pattern electrode of the substrate with wire bonding or other means can be omitted.

Other features, elements, characteristics and advantages of the present invention will become more apparent from the following detailed description of the preferred embodiments of the present invention with reference to the attached drawings.

DETAILED DESCRIPTION OF PREFERRED EMBODIMENTS

Hereinafter, the present invention will be more apparent from the following description of specific preferred embodiments of the present invention made with reference to the drawings.

Figure 1A:
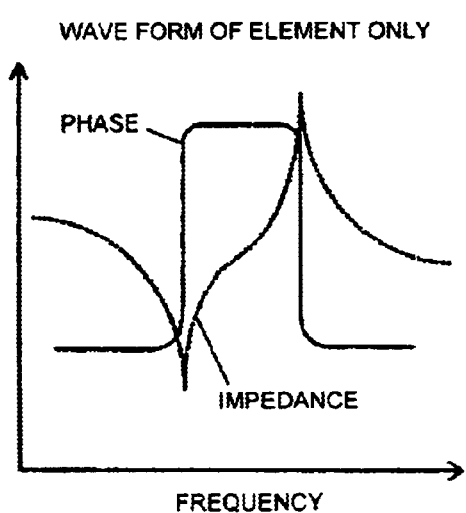
FIG. 1 is a waveform diagram showing the phase characteristics and the impedance characteristics of a single piezoelectric element, and of a piezoelectric element after being mounted on a substrate.
Figure 1B:
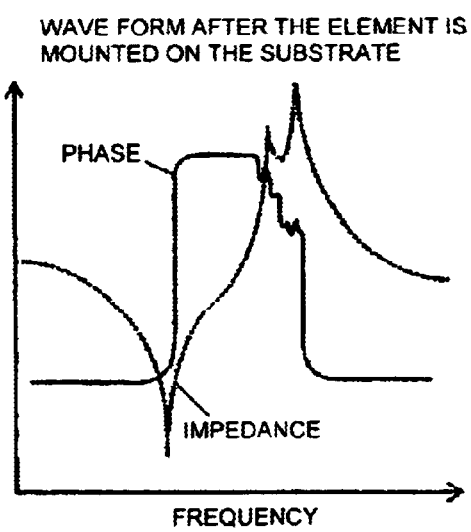
Figure 2:
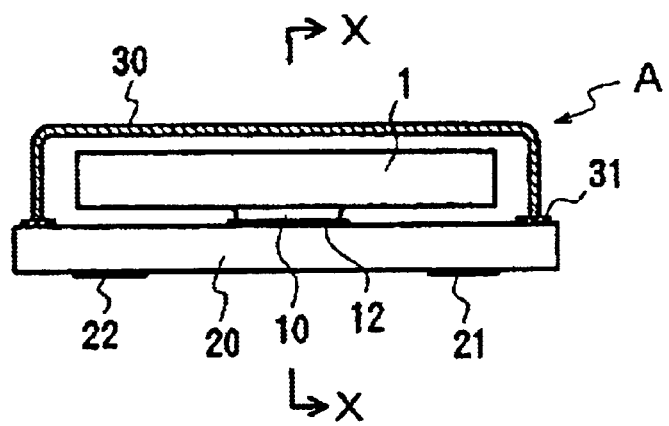
FIG. 2 is a sectional drawing of an example of a piezoelectric resonant component according to a preferred embodiment of the present invention.
Figure 3:
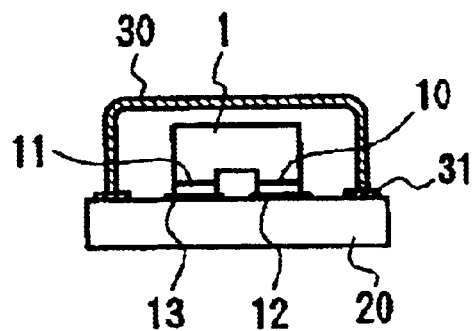
FIG. 3 is a cross sectional drawing along lines of X—X of FIG. 2.
Figure 4:
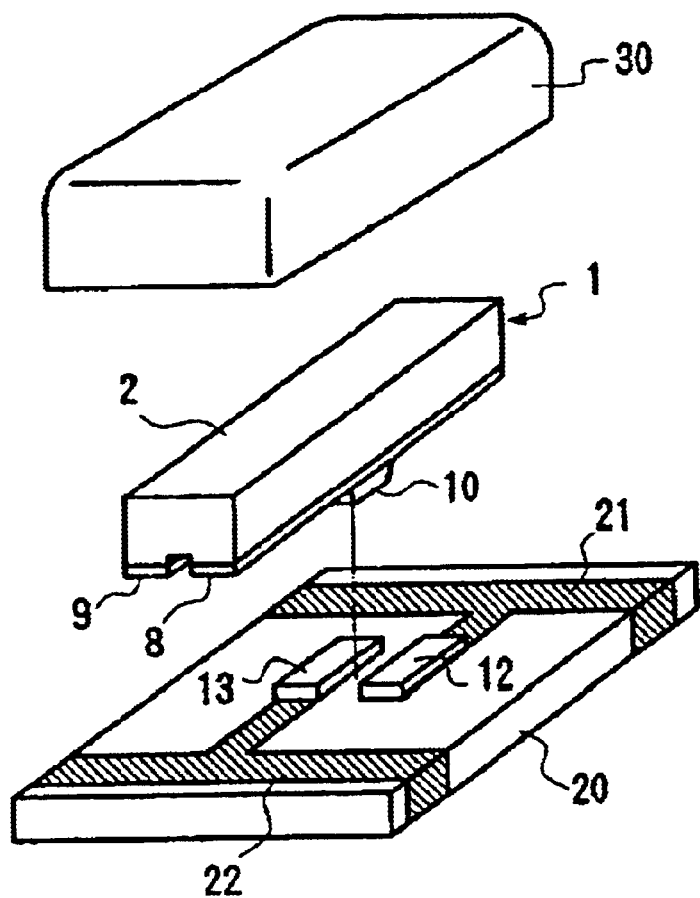
FIG. 4 is an exploded perspective view of the piezoelectric resonant component shown in FIG. 2.

FIGS. 2 to 4 show an example of a piezoelectric resonant component according to a preferred embodiment of the present invention. The piezoelectric resonant component of this preferred embodiment preferably is a surface mounting type oscillator that includes a piezoelectric element 1, a substrate 20, and a cap 30.

Figure 5:
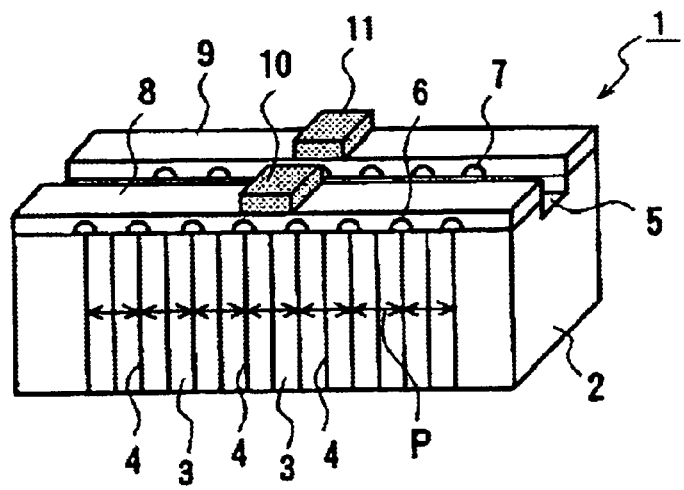
FIG. 5 is a perspective diagram of an example of the piezoelectric element included in the piezoelectric resonant component of FIG. 2.

A piezoelectric element 1 utilizes a longitudinal vibration mode, and as shown in FIG. 5, the piezoelectric element 1 includes a base 2 preferably having a substantially rectangular shape. The base 2 preferably has a structure including a plurality of piezoelectric layers 3 made of a piezoelectric ceramic material, and a plurality of internal electrodes 4 that are laminated alternately. As shown with an arrow P in FIG. 5, the polarization is performed in the longitudinal direction of the base 2 so that the polarization axes of the piezoelectric layers 3 on both sides of each of the internal electrodes 4 are opposite to each other. However, the polarization of the both ends of the base 2 is such that both ends of the base 2 are not polarized.

A groove 5 is arranged to extend in a longitudinal direction of the base 2 on one side of the base 2 such that the groove 5 divides one side of the base 2 in two. Furthermore, a first insulating film 6 and a second insulating film 7 are disposed on the side surfaces divided by the groove 5.

At the one side surface of the base 2 that is divided by the groove 5, exposed portions of internal electrodes 4 are coated by the first insulating film 6 alternately. At the other side surface divided by the groove 5 of the base 2, exposed portions of internal electrodes 4 which are not coated by the insulating film 6 are coated by the second insulating film 7 alternately. External electrodes 8 and 9 are disposed on both sides of the groove 5, more specifically, portions on which the insulating films 6 and 7 of the base 2 are disposed. Therefore, the internal electrodes 4 that are not coated by the first insulating film 6 are connected to the external electrode 8, and the internal electrodes 4 that are not coated by the second insulating film 7 are connected to the external electrode 9. In other words, the internal electrodes 4 are alternately connected with the external electrodes 8 and 9.

In the piezoelectric element 1, the external electrodes 8 and 9 are used as input/output electrodes. Since an electric field is applied between the adjacent internal electrodes 4 at all portions except at both ends of the base 2, portions of the piezoelectric element 1 become piezoelectrically active. However, since the polarization of the base 2 is not performed at both ends of the base 2, and the electrodes are not formed on both end surfaces of the base 2, an electric field is not applied and this portion becomes piezoelectrically inactive. Therefore, by inputting a signal between the external electrodes 8 and 9, the alternating current electric field of the longitudinal direction of the base 2 is applied to each piezoelectric layer 3 of an active portion, an expansion driving force is generated at each piezoelectric layer 3, and the fundamental vibration of a longitudinal vibration mode is excited by the base 2 as a whole. In addition, although an inactive portion is provided at both ends of the base 2, this inactive part is not absolutely necessary. That is, the whole base 2 may be piezoelectrically active.

As shown in FIG. 5, convex-shaped electro-conductive support bodies 10 and 11 are fixed to the longitudinal center section (node portion) of the external electrodes 8 and 9 of a piezoelectric element 1. These electro-conductive support bodies 10 and 11 connect and fix the external electrodes 8 and 9 of a piezoelectric element 1 with pattern electrodes 21 and 22 of a substrate 20, described later. After applying a coating of an electro-conductive paste so as to have a predetermined thickness on the external electrodes 8 and 9, the paste is hardened, thereby completing the electro-conductive support bodies 10 and 11. The electro-conductive support bodies 10 and 11 preferably include a urethane resin that preferably contains an Ag filler. It is preferred that the amount of Ag filler relative to the amount of urethane resin is approximately 75% to about 85% by weight.

Figure 6:
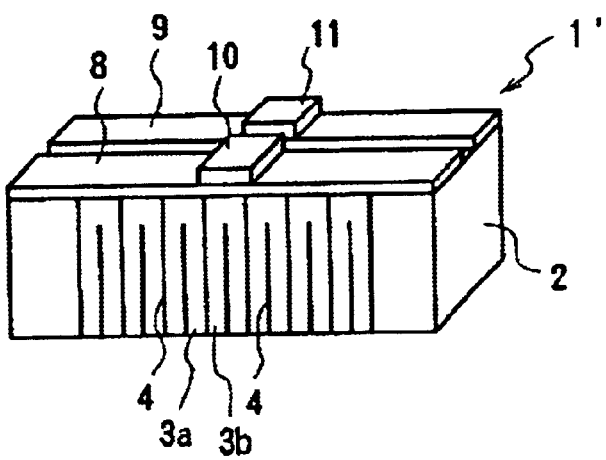
FIG. 6 is a perspective diagram of another example of the piezoelectric element included in the piezoelectric resonant component of FIG. 2.
Figure 7:
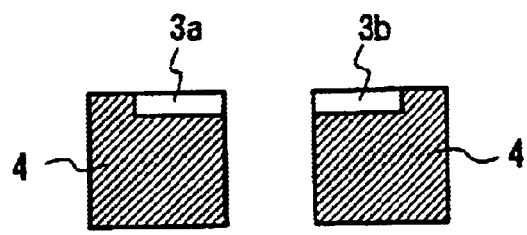
FIG. 7 is a front view of the piezoelectric layer included in the piezoelectric element of FIG. 6.

The structure of a piezoelectric element is not restricted to what is shown in FIG. 5, but it may modified to have the structure as shown in FIG. 6. In such a piezoelectric element 1', two kinds of piezoelectric layers 3a and 3b which are shown in FIG. 7 are laminated alternately, and the internal electrodes 4 are arranged to be exposed in two rows at one side surface of the base 2. The internal electrodes 4 are connected with the external electrodes 8 and 9 alternately by disposing the external electrodes 8 and 9 on a portion in which the internal electrodes 4 are exposed in two rows. In this case, a groove 5 is not required. The electro-conductive support bodies 10 and 11 are preferably fixed to the longitudinal center (node portion) of the external electrodes 8 and 9.

A substrate 20 preferably includes an insulating thin plate having a substantially rectangular shape and also is made of a material including one of an alumina-ceramic material, a glass-ceramic, a glass epoxy resin, a heat resistant resin, or other suitable material, and the pattern electrodes 21 and 22 of an input side and an output side are disposed on the top of the substrate 20 by well-known procedures, such as a sputtering, vapor deposition, and printing. The exterior connection portion of each of the pattern electrodes 21 and 22 is extended through a side edge of the substrate 20 to a back surface thereof. With the inner side edge portion of the pattern electrodes 21 and 22, the electro-conductive support bodies 10 and 11 fixed to the longitudinal center section (node portion) of the external electrodes 8 and 9 of the piezoelectric element 1 are fixed through the electro-conductive adhesives 12 and 13. As the electro-conductive adhesives 12 and 13, an epoxy group adhesive that contains about 73% by weight of the Ag filler, for example, is used. Thereby, the external electrodes 8 and 9 for defining input and output electrodes of the piezoelectric element 1 are respectively electrically connected to the pattern electrodes 21 and 22 of the substrate 20. Moreover, the piezoelectric element 1 is horizontally attached by the electro-conductive support bodies 10 and 11 to the substrate 20, and a predetermined gap is provided between both ends of the piezoelectric element 1 and the substrate 20.

On the substrate 20, the cap 30 which covers the piezoelectric element 1 is adhered with the insulating adhesive 31, and the periphery of the piezoelectric element 1 is sealed. Although the cap 30 of this preferred embodiment is preferably formed by performing press forming a metal plate, the cap may also be a resin cap or a ceramic cap.

Figure 8A:
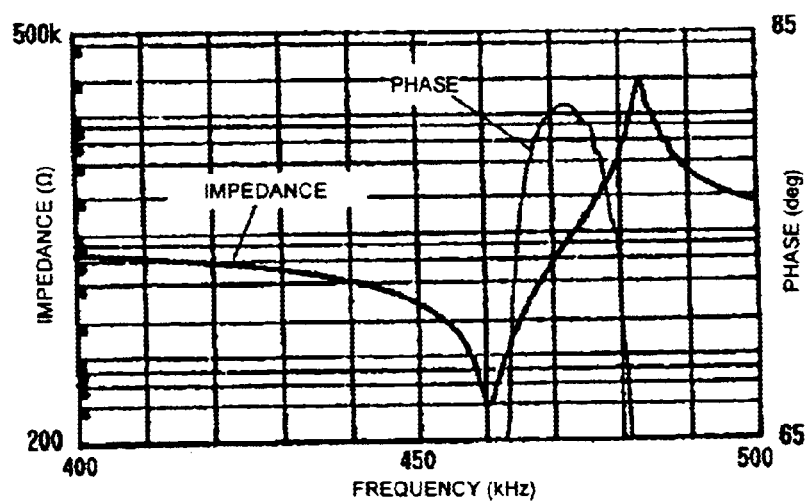
FIG. 8 is a figure showing the phase characteristics and the impedance characteristic of a piezoelectric resonant component when changing the composition of an electro-conductive support body.
Figure 8B:
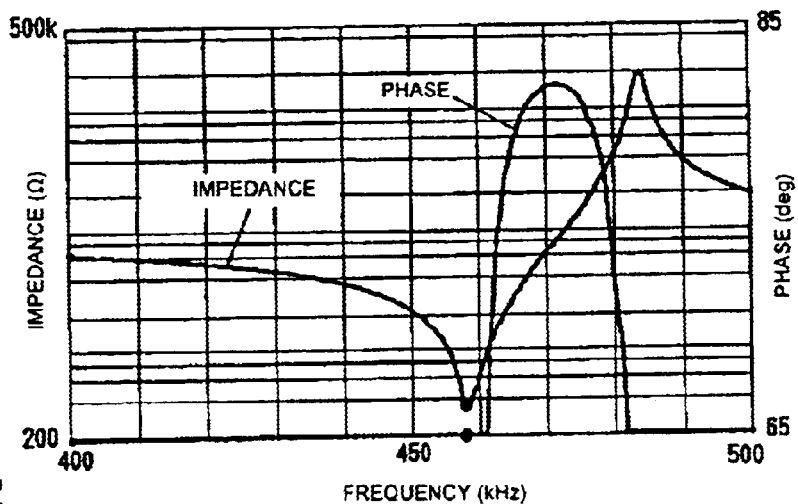
Figure 8C:
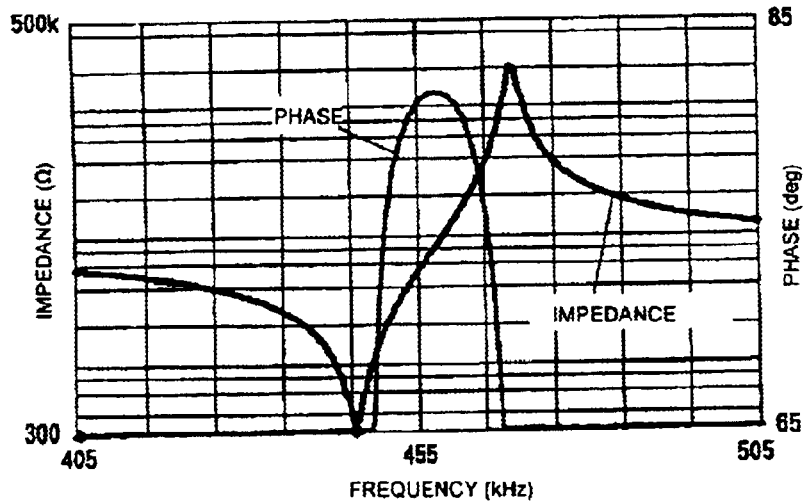

FIG. 8 shows a result in which the phase characteristics and the impedance characteristics are measured by using three kinds of piezoelectric resonant components (A), (B), and (C), wherein the content ratio of an Ag filler and a urethane resin is respectively made to be approximately 85:15, about 81:19, and about 75:25 for defining the electro-conductive support bodies 10 and 11.

Figure 9:
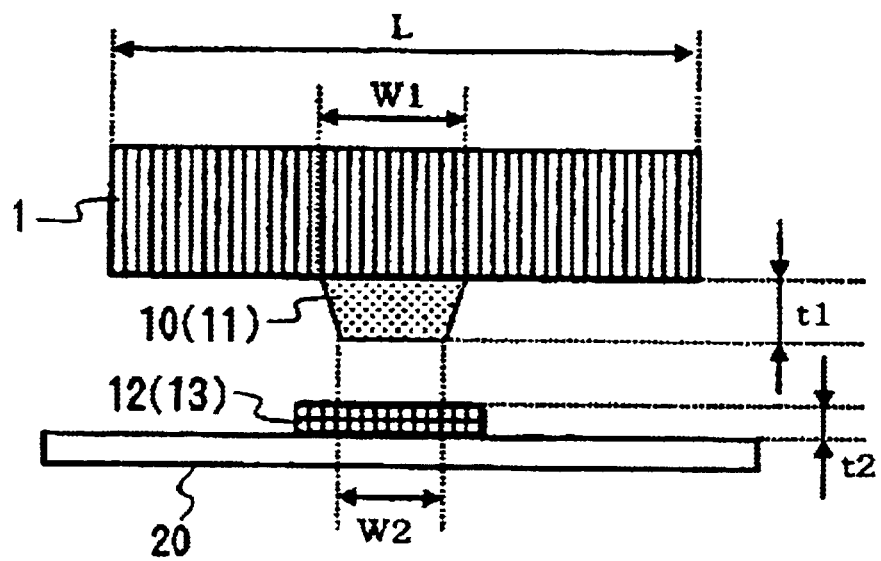
FIG. 9 is a figure of a manufacturing trial model of the piezoelectric resonant component for measuring the characteristics of FIG. 8.

Here, as shown in FIG. 9, the dimension L of a length direction of the piezoelectric element 1, the width W1 of the support bodies 10 and 11, the adhesive surface length W2 of the support bodies 10 and 11, the height t1 of the support bodies 10 and 11, the thickness t2 of electro-conductive adhesives 12 and 13, and the dimension of a substrate 20 were set up as follows:

L = 4.32 mm
W1 = 1.0–1.2 mm
W2 = 0.6–0.8 mm
t1 = 140–170 micro-m
t2 = 30–40 micro-m Substrate: Alumina substrate with dimensions of 9.5 mm×6.5 mm×0.5 mm As shown in FIG. 8, when the content ratio is about 85:15, some phase disorder is generated at a high band pass side. When the content ratio is about 81:19, phase disorder is hardly generated, but when the content ratio is about 75:25, the phase disorder is still small. In addition, the phase disorder will be abruptly increased, when the content ratio of the Ag filler and the urethane resin exceeds approximately 85:15. Therefore, it shows that the vibration of the piezoelectric element 1 is prevented from being transmitted to the substrate 20 by the electro-conductive support bodies 10 and 11 as the percentage composition of the Ag filler is decreased. In addition, concerning the impedance characteristics, the characteristics with 3 types of favorable samples were obtained.

Figure 10:
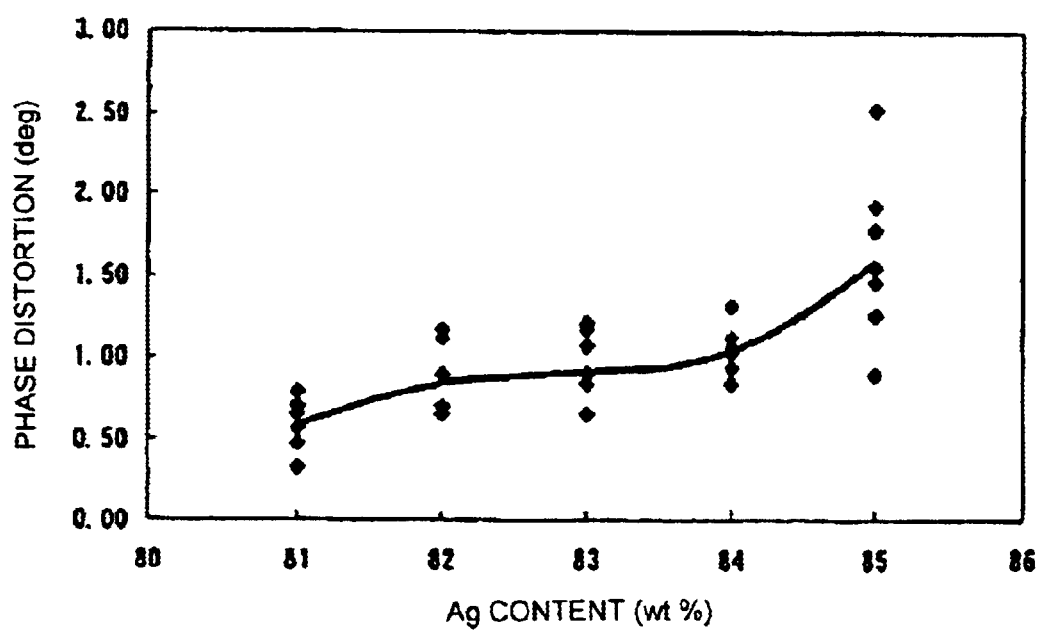
FIG. 10 is a graph of phase distortion when changing the ratio of Ag filler to the urethane resin within a range of approximately 81% to about 85% by weight.
Figure 11:
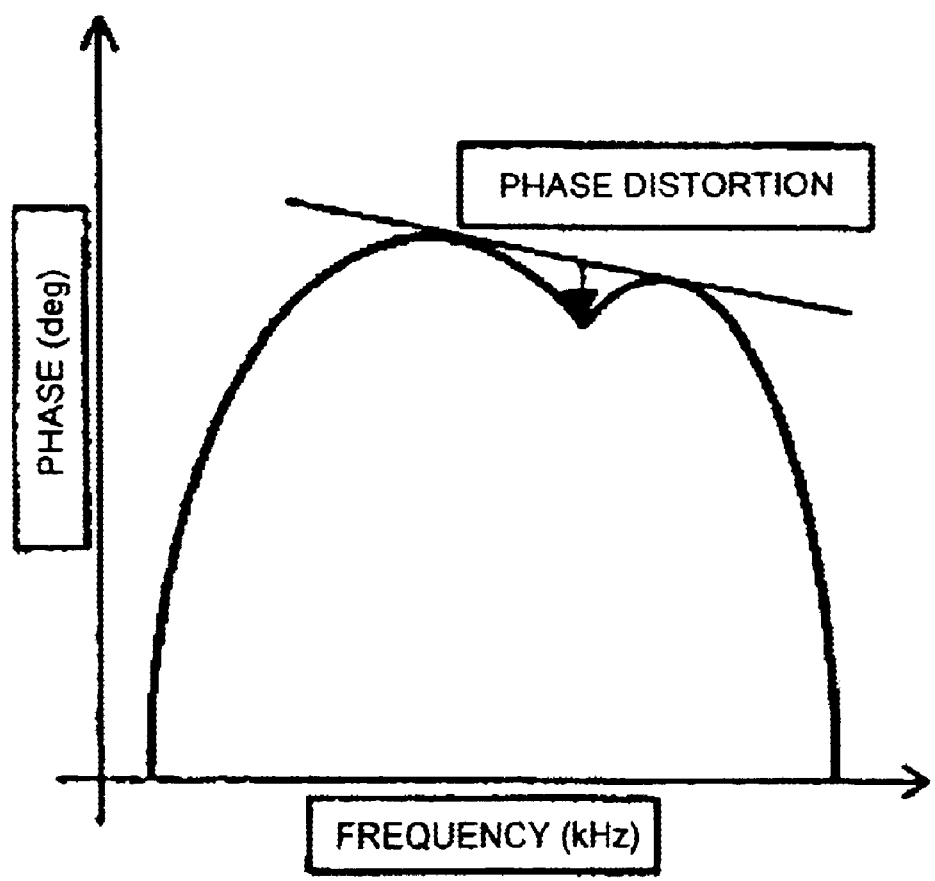
FIG. 11 is a figure showing how to determine a phase distortion.

FIG. 10 shows a result of the measurement of the phase distortion when changing the contents ratio of the Ag filler relative to the urethane resin to about 81% to about 85% by weight. In addition, the phase distortion was measured in the amount of depression from the line connecting the vertexes of the phase curves, as shown in FIG. 11. FIG. 10 shows clearly, up to about 84% by weight of Ag content, the phase distortion is low. However, when the Ag content becomes about 85% by weight, it turns out that the phase distortion and its dispersion are large. Thus, there is a correlation between a phase distortion and an oscillating leak. In order not to be influenced by spurious ripples in an impedance circuit, it is desirable to make the Ag content about 84% or less by weight.

Figure 12:
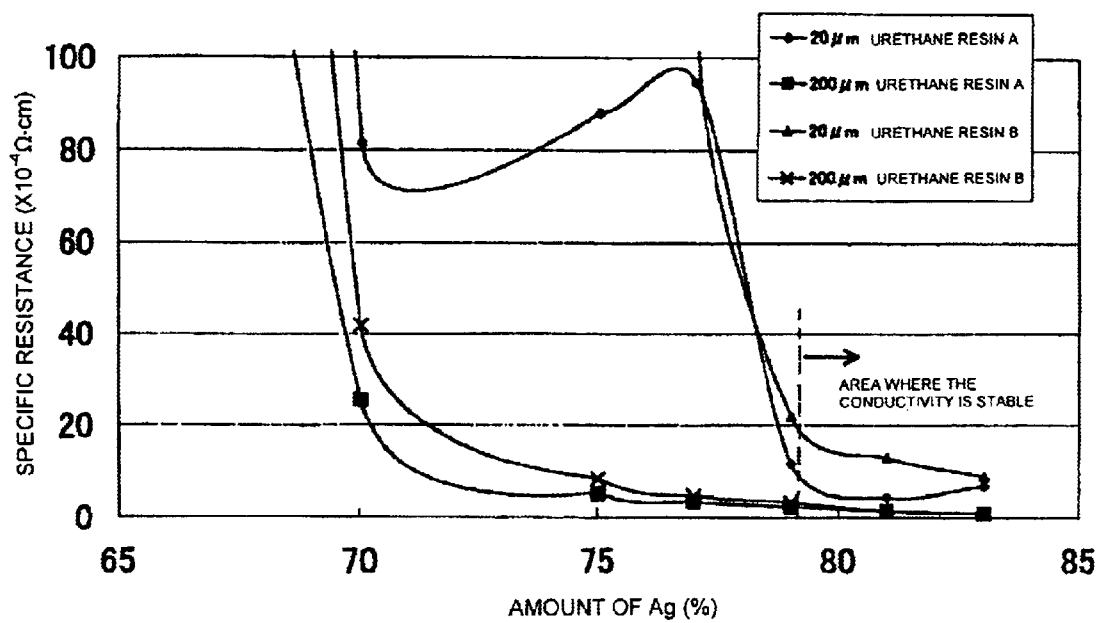
FIG. 12 is a figure showing a change of the electric conduction property when changing the content of Ag filler of an electro-conductive support body.

FIG. 12 shows a change of the electric conduction property when changing the content of Ag filler of the electro-conductive support bodies 10 and 11.

Here, while two types of urethane resins were used, the thickness of the electro-conductive support bodies 10 and 11 was made into two types, one have a thickness of 20 micrometers and one having a thickness of 200 micrometers. A total of four types of samples were produced, and the relationship of the content of Ag filler and a specific resistance was calculated.

As shown in FIG. 12, when the thickness of the electro-conductive support bodies 10 and 11 is about 200 micrometers, the content of Ag filler was about 70% by weight or more and the specific resistance becomes less than about $20 \times 10^{-4}$ (ohm×cm) and favorable electroconductivity was obtained. On the one hand, when the thickness of the electro-conductive support bodies 10 and 11 is about 20 micrometers, the content of Ag filler is preferably about 79% by weight or more. The specific resistance was reduced to less than about $20 \times 10^{-4}$ (ohm×cm), and favorable electroconductivity was obtained. Therefore, if the content of Ag filler is about 79% by weight or more, electroconductivity stabilized regardless of the thickness of a support body can be obtained.

Figure 13:
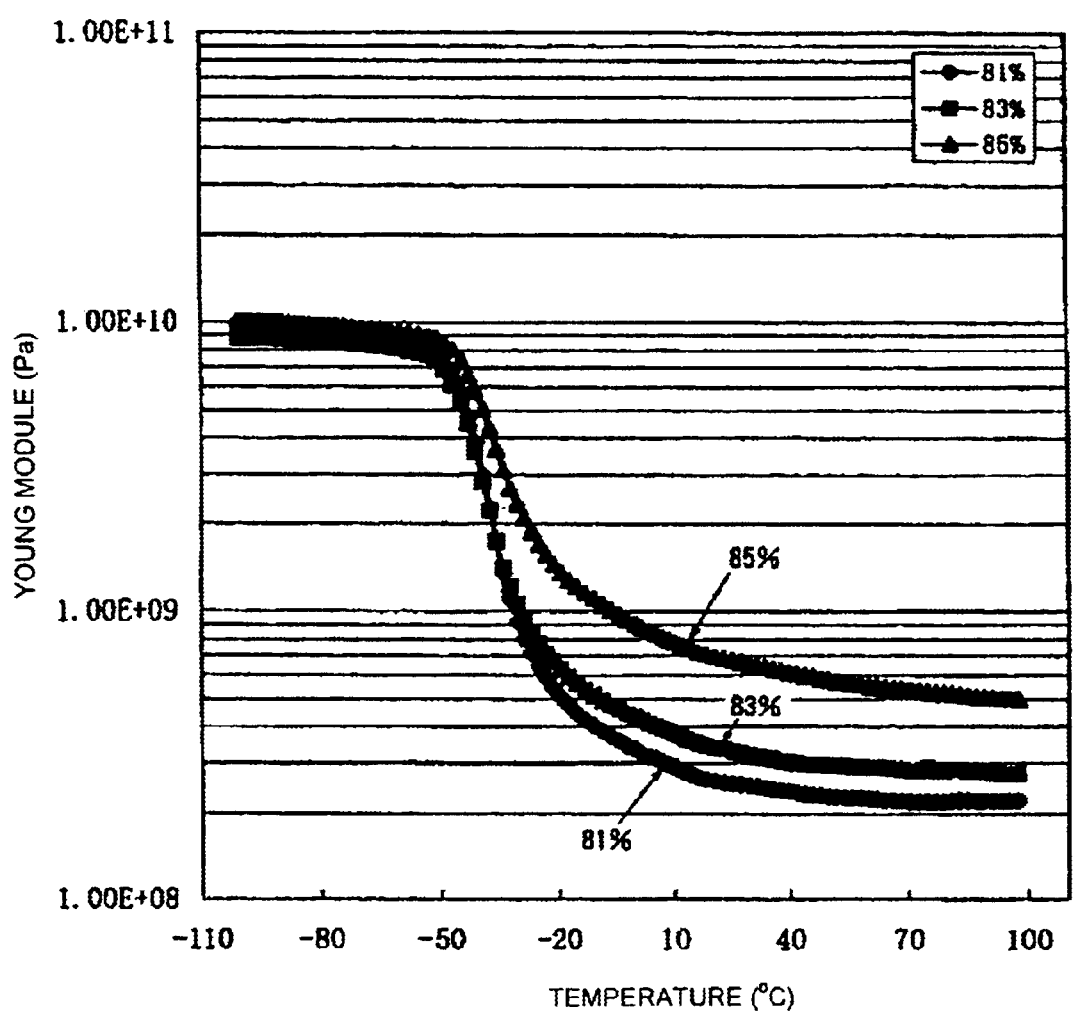
FIG. 13 is a figure showing a change of the Young's modulus by the temperature change of an electro-conductive support body.

FIG. 13 shows a change of the Young's modulus according to a temperature change of the electro-conductive support bodies 10 and 11. In FIG. 13, the content percentage of Ag filler with respect to the urethane resin is preferably about 85% by weight in (A), and is preferably about 83% by weight in (B), and it may be about 81% by weight in (C).

Also, at about −20 degree C., predetermined phase characteristics and an impedance characteristic are needed for desired characteristics of a piezoelectric resonant component. If the amount of content of Ag filler is about 85% or less by weight, since a Young's modulus will become less than about 1.00E+09 (Pa) at about −20 degree C. as clearly shown in FIG. 13, a Young's modulus can be maintained low and oscillating propagation from the piezoelectric element 1 to the substrate 20 can be effectively eliminated.

Although the example of the surface mount type oscillator was shown as a piezoelectric resonant component in the above-described preferred embodiments, the present invention is not restricted to this. The present invention can be applied to a ladder filter or other suitable device.

Although piezoelectric elements 1, 1' including a longitudinal vibration mode element having a laminated body with a plurality of piezoelectric layers were described in the above preferred embodiments shown in FIGS. 5 and 6, the present invention is not restricted to these preferred embodiments. The present invention may also be applied to a longitudinal vibration mode element wherein electrodes are disposed on both main surfaces of one piezoelectric substrate.

Moreover, the piezoelectric element is not restricted to an element having electrodes provided on only the lower surface of the element, but it may also include a piezoelectric element in which the electrodes are provided on the upper and lower surfaces of the piezoelectric element. In this case, an upper surface electrode and a pattern electrode of the substrate may be connected via wire bonding or other suitable elements.

According to preferred embodiments of the present invention, in a piezoelectric resonant component in which the longitudinal center section of the lower surface electrode of the piezoelectric element is fixed through an electro-conductive support body to the pattern electrode of the substrate, since the electro-conductive support body includes a urethane resin which contains an electro-conductive filler and has a composition of an electro-conductive filler of about 75% to about 85% by weight, it can eliminated the vibration of the piezoelectric element that propagates to the substrate and prevents the waveform disorders from being generated in the phase characteristics or an impedance waveform. Furthermore, more than sufficient electroconductivity is securely and reliably achieved.

Moreover, since an electro-conductive support body has a rubber elasticity, even if an impact force is applied thereto, the impact force is absorbed because of the elasticity of an electro-conductive support body. Thus, the impact force does not affect or damage the piezoelectric element, and thereby peeling or disconnection of the piezoelectric element is reliably prevented.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric resonant component comprising:
   a substrate having a pattern electrode on a top surface thereof;
   a piezoelectric element vibrating in a longitudinal vibration mode and having an electrode that is disposed on a lower surface of the substrate; and
   an electro-conductive support body disposed at a longitudinal center of said piezoelectric resonant component and an the lower surface electrode of said piezoelectric element; wherein
   the electro-conductive support body includes an electro-conductive adhesive and is fixed to the pattern electrode of the substrate by the electro-conductive adhesive, the electro-conductive support body includes a urethane resin containing an electro-conductive filler that is about 75% to about 85% by weight of the electro-conductive support body;
   said electro-conductive support body has a Young's modulus of less than about $1.00 \times 10^9$ Pa; and
   the electro-conductive support body is provided and arranged to eliminate vibrations of the piezoelectric element from propagating to the substrate.

2. A piezoelectric resonant component according to claim 1, wherein said piezoelectric element includes a pillar-shaped base having a plurality of piezoelectric layers and a plurality of internal electrodes that are laminated together in the length direction, two external electrodes are arranged so that they are connected with the internal electrodes alternately at one side surface of the base, and the polarization of the piezoelectric layer is along the length direction of the base.

3. A piezoelectric resonant component according to claim 1, wherein the electro-conductive support body is located at a node of the piezoelectric element.

4. A piezoelectric resonant component according to claim 1, wherein the urethane resin includes a rubber elastic material.

5. A piezoelectric resonant component according to claim 1, wherein the electro-conductive filler includes one of Ag, Cu, Ag and CU, and Au.

6. A piezoelectric resonant component according to claim 1, wherein the direction of a polarization, the direction of an electric field, and the vibrating direction of the piezoelectric element are the same.

7. A piezoelectric resonant component according to claim 1, further comprising an input electrode and an output electrode disposed on an entire surface of the piezoelectric element.

8. A piezoelectric resonant component according to claim 1, wherein the piezoelectric element has a base that has a substantially rectangular shape.

9. A piezoelectric resonant component according to claim 8, wherein the base includes a plurality of piezoelectric layers made of a piezoelectric ceramic material and a plurality of internal electrodes that are laminated alternately.

10. A piezoelectric resonant component according to claim 8, wherein the base is piezoelectrically active along the entire base.

11. A piezoelectric resonant component according to claim 8, wherein the base is piezoelectrically active along a first portion of the base and piezoelectrically inactive along a second portion of the base.

12. A piezoelectric resonant component according to claim 8, wherein the base is piezoelectrically inactive at both ends thereof.

13. A piezoelectric resonant component according to claim 8, wherein the base has a groove formed in a surface thereof extending in a longitudinal direction of the base.

14. A piezoelectric resonant component according to claim 8, wherein the base has first and second insulation films disposed on surfaces thereof.

15. A piezoelectric resonant component according to claim 1, wherein the electro-conductive support body is convex-shaped.

16. A piezoelectric resonant component according to claim 1, further comprising a pair of the electro-conductive support bodies disposed at the longitudinal center section of the piezoelectric element.

17. A piezoelectric resonant component according to claim 1, wherein the substrate includes an insulating thin plate having a substantially rectangular shape.

18. A piezoelectric resonant component according to claim 1, wherein the substrate is made of one of an alumina-ceramic material, a glass-ceramic, a glass epoxy resin, and a heat resistant resin.

* * * * *